United States Patent
Tsai et al.

(10) Patent No.: US 9,870,896 B2
(45) Date of Patent: Jan. 16, 2018

(54) SYSTEM AND METHOD FOR CONTROLLING ION IMPLANTER

(71) Applicant: TAIWAN SEMICONDUCTOR MANUFACTURING CO., LTD., Hsinchu (TW)

(72) Inventors: Po-Feng Tsai, Taipei (TW); Chia-Tong Ho, Taipei (TW); Chia-Hsing Liao, Hsinchu County (TW); Sheng-Wei Lee, Hsinchu (TW); Jo-Fei Wang, Hsin-Chu (TW); Jong-I Mou, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 258 days.

(21) Appl. No.: 14/099,672

(22) Filed: Dec. 6, 2013

(65) Prior Publication Data
US 2015/0162166 A1 Jun. 11, 2015

(51) Int. Cl.
*H01J 37/317* (2006.01)
*H01J 37/304* (2006.01)

(52) U.S. Cl.
CPC ........ *H01J 37/3171* (2013.01); *H01J 37/304* (2013.01); *H01J 2237/30455* (2013.01); *H01J 2237/31711* (2013.01)

(58) Field of Classification Search
CPC .. H01J 37/3137; H01J 37/3171; H01J 37/304; H01J 2237/30455; H01J 2237/31711
USPC .................................................. 700/108, 121
See application file for complete search history.

(56) References Cited

U.S. PATENT DOCUMENTS

| | | | | |
|---|---|---|---|---|
| 6,888,149 B2* | 5/2005 | Ikku | ..................... | H01J 37/3056 250/491.1 |
| 7,355,188 B2* | 4/2008 | Olson | ................... | H01J 37/304 250/398 |
| 7,663,125 B2* | 2/2010 | Callahan | ............. | H01J 37/3171 250/396 R |
| 8,229,588 B2* | 7/2012 | Tsen | ..................... | G05B 13/044 700/103 |
| 9,519,285 B2* | 12/2016 | Tsai | ................... | G05B 19/4065 |
| 2003/0042427 A1* | 3/2003 | Sullivan | ................ | H01J 37/244 250/397 |
| 2004/0143357 A1* | 7/2004 | Schwarm | ........... | G05B 23/0221 700/121 |
| 2005/0085032 A1* | 4/2005 | Aghababazadeh | | G01R 31/2831 438/232 |
| 2005/0263721 A1* | 12/2005 | Renau | ................. | H01J 37/3023 250/492.21 |

(Continued)

*Primary Examiner* — Kenneth M Lo
*Assistant Examiner* — Michael J Huntley
(74) *Attorney, Agent, or Firm* — McDermott Will & Emery LLP

(57) ABSTRACT

A system, a method, and a non-transitory computer readable storage medium for controlling an ion implanter are disclosed herein. The system includes a sample module and a control module. The sample module is configured to generate a summarized value from process data of the ion implanter, and the process data correspond to a control parameter. The control module is configured to tune a control parameter, and the control module performs an ion implantation by releasing tools of the ion implanter in accordance with the control parameter when the summarized value meets a predetermined stability requirement.

20 Claims, 4 Drawing Sheets

(56) References Cited

U.S. PATENT DOCUMENTS

| | | | |
|---|---|---|---|
| 2006/0076510 A1* | 4/2006 | Chang | H01J 37/3171 250/492.21 |
| 2008/0148216 A1* | 6/2008 | Chan | G03F 1/36 716/53 |
| 2008/0245957 A1* | 10/2008 | Gupta | H01J 37/3023 250/252.1 |
| 2009/0121122 A1* | 5/2009 | Kellerman | H01J 37/244 250/252.1 |
| 2009/0162953 A1* | 6/2009 | Evans | H01J 37/304 438/10 |
| 2009/0242808 A1* | 10/2009 | Evans | H01J 37/304 250/492.21 |
| 2012/0068081 A1* | 3/2012 | Chang | H01J 37/21 250/397 |
| 2012/0085936 A1* | 4/2012 | Berrian | H01J 37/3171 250/492.3 |
| 2012/0130525 A1* | 5/2012 | Tsai | G05B 19/41875 700/108 |
| 2012/0196047 A1* | 8/2012 | Shen | H01J 37/3171 427/526 |
| 2015/0162166 A1* | 6/2015 | Tsai | H01J 37/3171 250/492.21 |

* cited by examiner

SYSTEM AND METHOD FOR CONTROLLING ION IMPLANTER

BACKGROUND

Description of Related Art

Ion implantation has been a key technology in semiconductor device manufacturing. When doped regions are formed on a semiconductor substrate by the ion implantation, the ion implantation requires high stability and accuracy in order to reduce variations of the formed doped regions. Yield rate and production cost of the semiconductor devices are occasionally affected by the ion implantation. Therefore, an ion implanter which performs the ion implantation is tuned before semiconductor devices are manufactured.

BRIEF DESCRIPTION OF THE DRAWINGS

The invention can be more fully understood by reading the following detailed description of the embodiment, with reference made to the accompanying drawings as follows.

DETAILED DESCRIPTION

In the following description, specific details are presented to provide a thorough understanding of the embodiments of the present disclosure. Persons of ordinary skill in the art will recognize, however, that the present disclosure can be practiced without one or more of the specific details, or in combination with other components. Well-known implementations or operations are not shown or described in detail to avoid obscuring aspects of various embodiments of the present disclosure.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Figure 1:
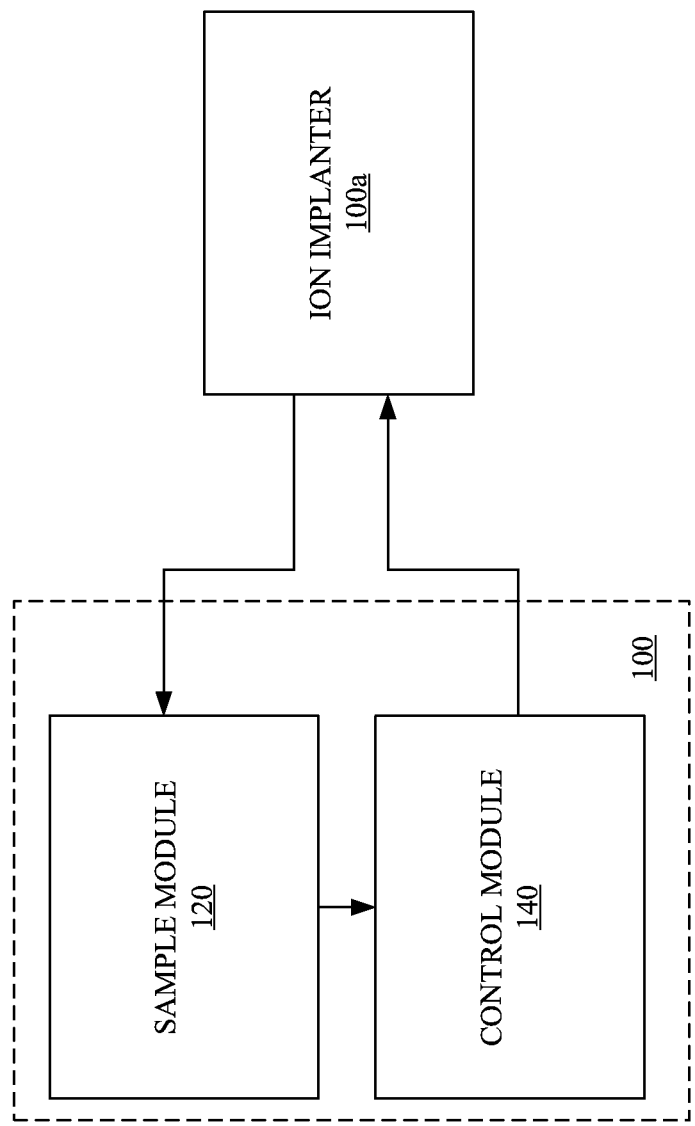
FIG. 1 is a schematic diagram of a system in accordance with various embodiments of the present disclosure.

FIG. 1 is a schematic diagram of a system 100 in accordance with various embodiments of the present disclosure. As illustratively shown in FIG. 1, the system 100 is electrically coupled to an ion implanter 100a. The system 100 is configured to control the ion implanter 100a for performing ion implantation onto one or more semiconductor substrates.

The system 100 includes a sample module 120 and a control module 140. The sample module 120 is configured to receive process data transmitted from the ion implanter 100a and generate a summarized value in accordance with the process data. The process data correspond to one or more control parameters. The control module 140 is configured to tune the control parameter and perform ion implantation in accordance with the control parameter when the summarized value meets a predetermined stability requirement. In various embodiments, the predetermined stability requirement includes a limitation of the summarized value, a recipe specification for practical applications, etc.

In some embodiments, the aforementioned process data relate to an ion beam generated from the ion implanter 100a. The ion beam is adjusted by setting at least one of the control parameters of the ion implanter 100a. For example, the process data include beam current, beam angle, etc.

For illustration, the ion beam is transmitted through a stencil mask (not labeled) of the ion implanter 100a onto semiconductor substrates, and the beam current is responsive to the position of stencil mask. In some embodiments, the beam current changes when the position of stencil mask changes. Explained in a different way, the position of stencil mask affects the beam current or numbers of ions being implanted during the ion implantation. In various embodiments, the control parameters include a source magnetic force, focus of the ion beam, coordinate values (X/Y/Z axes) of the stencil mask, etc.

In some embodiments, the system 100 is a controller chip. In various embodiments, the system 100 is a design tool carried on a non-transitory computer-readable medium, or a program code embedded in the ion implanter 100a and executed by a processor of the ion implanter 100a. In other words, the system 100 is implemented by hardware, software, firmware, or the combination thereof. For illustration, if speed and accuracy are determined to be paramount, a hardware and/or firmware implementation is mainly selected and utilized. Alternatively, if flexibility is paramount, a software implementation is mainly selected and utilized.

Figure 2:
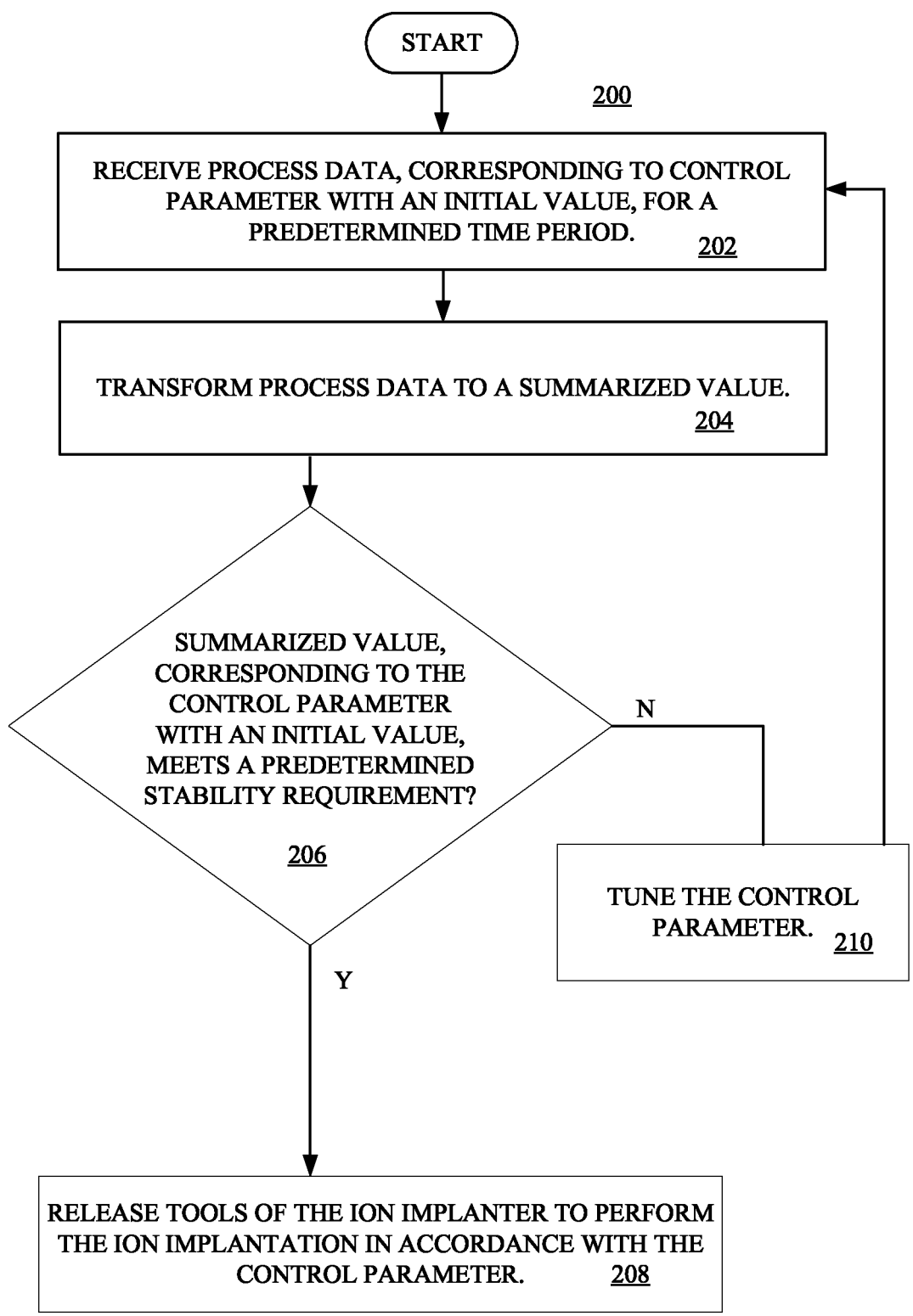
FIG. 2 is a flow chart of a method illustrating operations of the system in FIG. 1, in accordance with various embodiments of the present disclosure.

FIG. 2 is a flow chart of a method 200 illustrating operations of the system 100 in FIG. 1, in accordance with various embodiments of the present disclosure. For illustration, the operations of the system 100 in FIG. 1 are described by the method 200 with reference to FIG. 2.

In operation 202, the sample module 120 receives the process data, corresponding to the control parameter with an initial value, for a predetermined time period. Effectively, the sample module 120 receives time-series process data corresponding to the control parameter.

In operation 204, the sample module 120 transforms the process data to a summarized value. In some embodiments, the sample module 120 generates the summarized value by performing statistical analysis on the process data. In further embodiments, the summarized value is a static index. For example, the static index includes an average value, an expected value, a coefficient of variation, etc.

In operation 206, the control module 140 checks whether the summarized value, corresponding to the control parameter with the initial value, meets the predetermined stability requirement. If the summarized value meets the predetermined stability requirement, operation 208 is performed. If not, operation 210 is performed.

In operation 208, the control module 140 releases tools of the ion implanter 100a to perform the ion implantation in accordance with the control parameter.

In operation 210, the control module 140 tunes the control parameter. After the operation 210 is performed, the system 100 performs the operation 202 again. As a result, by tuning the control parameter, the process data with maximum response, of the ion implanter 110a, is optimized before the ion implantation is performed on the semiconductor substrates, and errors, offsets, or variations caused by the ion implantation on the semiconductor substrates are reduced.

For illustrative purposes, the process data are regarded as the beam current and the control parameter is regarded as a coordinate value of the position of the stencil mask in the following descriptions. Other types of the process data and the control parameters are within the contemplated scope of the present disclosure.

For illustration, Table 1 lists initial conditions of the beam current and the coordinate value of the stencil mask of the ion implanter 100a, in accordance with various embodiments of the present disclosure.

TABLE 1

| Current Value | Coordinate Value | | | Count | Unit |
|---|---|---|---|---|---|
| 12.2 | PA | TH1 | TH2 | 1 | 0.1 |
| | 3 | 15 | 5 | | |
| Beam Current | | | | | |
| Target | | UL | | LL | |
| 2 | | 4 | | 1.8 | |
| Response | | | | | |
| 0 | 1 | 1 | 3 | 2 | 2 | 4 | 1 | 2 | 1 |
| Mean value | | | | 1.625 | |

The predetermined adjusted value PA indicates a search range of the coordinate value. The first threshold level TH1 indicates an upper limit of the coordinate value, and the second threshold level TH2 indicates a lower limit of the coordinate value. Count is the number of times the coordinate value has been tuned. Unit is a minimum value for tuning the coordinate value. Target indicates a desired value of the beam current. Upper limit UL and lower limit LL indicate the stability requirements for the beam current.

For illustration, the sample module 120 receives the beam current, corresponding to the control parameter with the initial value (12.2), for a predetermined time period of ten seconds, and the beam current is measured per second. Table 1 lists ten values of the received beam current.

In some embodiments, the sample module 120 filters high noise data of the beam current and characterizes the filtered beam current to obtain the summarized value. For example, a maximum value and a minimum value of the beam current are considered as values caused by the noise. The sample module 120 removes the maximum value (4) and the minimum value (0) of the beam current listed in Table 1, and averages the rest values of the beam current to obtain a mean value (1.625).

Further, the control module 140 compares the mean value (1.625) with the lower limit LL (1.8) of the beam current to determine that the mean value (1.625), corresponding to the initial value (12.2), is less than the lower limit LL (1.8) of the beam current. As a result, this means that the mean value (1.625) does not meet the stability requirements for the beam current.

Figure 3A:
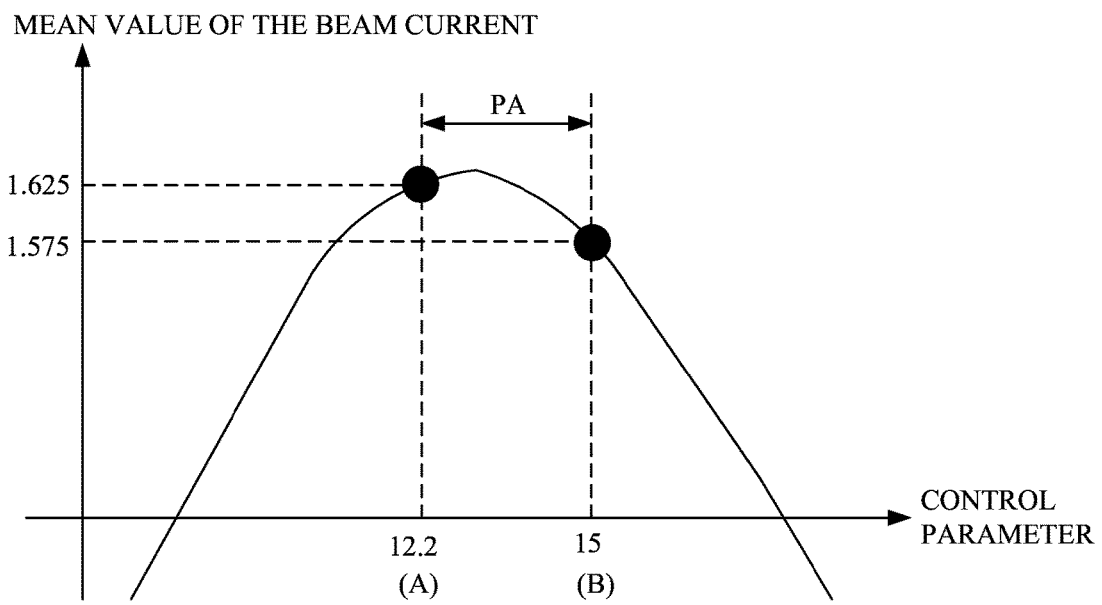
FIG. 3A is a schematic diagram illustrating operations of the system in FIG. 1, in accordance with various embodiments in Table 1.

FIG. 3A is a schematic diagram illustrating operations of the system 100 in FIG. 1, in accordance with various embodiments in Table 1. For illustration, please refer to both of FIG. 3A and Table 1.

The control module 140 determines a sum of the initial value A (12.2) and the predetermined adjusted value PA (3) to obtain a first result value (15.2). The control module 140 adjusts the coordinate value to a first value B, and the first value B is determined by the following equation:

$$B=\text{Minimum}(\text{initial value}+PA, TH1)=\text{Minimum}(12.2+3, 15)=15.$$

In other words, the control module 140 selects a smaller one of the first result value (15.2) and the first threshold level TH1 (15), as the first value B. As shown in FIG. 3A, the control module 140 adjusts the coordinate value from the initial value A (12.2) to the first value B (15). Then, the sample module 120 samples the values of the beam current for ten seconds again.

For illustration, Table. 2 lists a second condition of the beam current and the coordinate value of the stencil mask of the ion implanter 100a, in accordance with various embodiments of the present disclosure.

TABLE 2

| Current Value | Coordinate Value | | | Count | Unit |
|---|---|---|---|---|---|
| 15 | PA | TH1 | TH2 | 2 | 0.1 |
| | 3 | 15 | 5 | | |
| Beam Current | | | | | |
| Target | | UL | | LL | |
| 2 | | 4 | | 1.8 | |
| Response | | | | | |
| 1.7 | 1.9 | 2.6 | 1.3 | 1.4 | 1.5 | 2 | 0.5 | 1 | 1.8 |
| Mean value | | | | 1.575 | |

Similarly, the sample module 120 removes the maximum value (2.6) and the minimum value (0.5) of the beam current listed in Table. 2, and averages the rest values of the beam current to obtain the mean value (1.575). The control module 140 determines that the mean value (1.575), corresponding to the first value B (15), does not meet the stability requirements for the beam current.

Figure 3B:
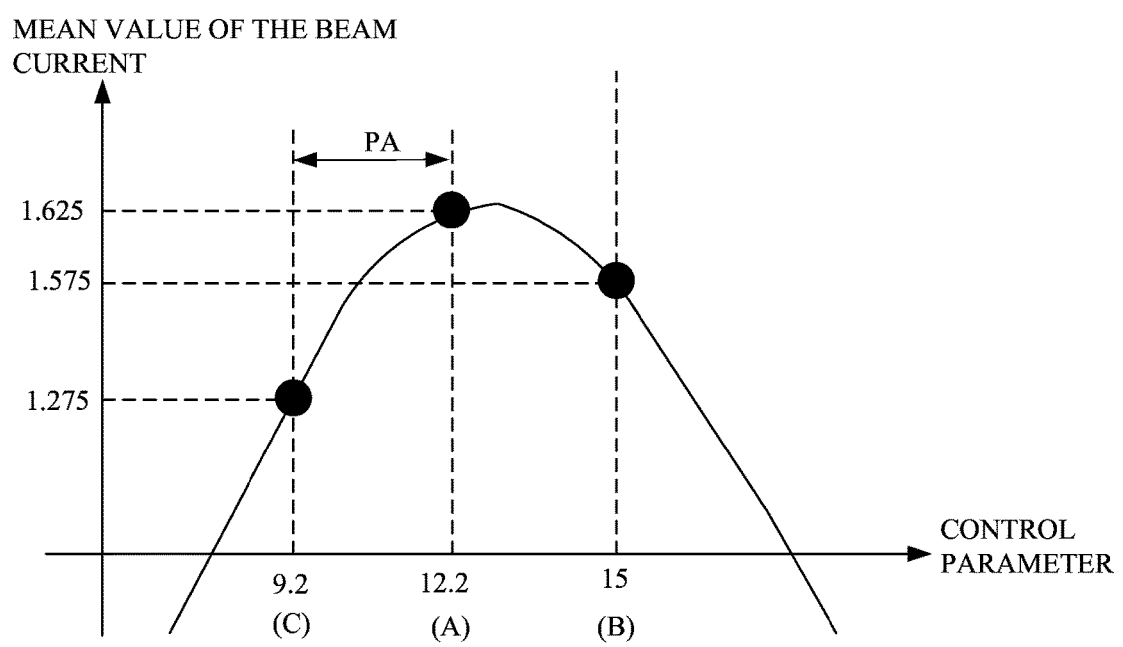
FIG. 3B is a schematic diagram illustrating operations of the system in FIG. 1, in accordance with various embodiments in Table 2.

FIG. 3B is a schematic diagram illustrating operations of the system 100 in FIG. 1, in accordance with various embodiments in Table 2. For illustration, please refer to both of FIG. 3B and Table 2.

In this case, the control module 140 starts to tune the coordinate value again. The control module 140 determines a difference between the initial value (12.2) and the predetermined adjusted value PA (3) to obtain a second result value (9.2). The control module 140 adjusts the coordinate value to a second value C, and the second value C is determined by the following equation: C =Maximum (initial value-PA, TH2) =Maximum (12.2−3, 5) =9.2.

In other words, the control module 140 chooses the bigger one of the second result value (9.2) and the second threshold level TH2, 5, as the second value C. As shown in FIG. 3B, the control module 140 adjusts the coordinate value to second value B (9.2) and the sample module 120 samples the values of the beam current for ten seconds again.

For illustration, Table 3 lists third conditions of the beam current of and the coordinate value of the stencil mask of the ion implanter 100a, in accordance with various embodiments of the present disclosure.

TABLE 3

| Current Value | Coordinate Value | | | Count | Unit |
|---|---|---|---|---|---|
| | PA | TH1 | TH2 | | |
| 9.2 | 3 | 15 | 5 | 3 | 0.1 |
| | Beam Current | | | | |
| Target | | UL | | LL | |
| 2 | | 4 | | 1.8 | |
| | Response | | | | |
| 1 | 1 | 1.5 | 1.3 | 1.1 | 1.5 | 2.2 | 0.4 | 1 | 1.8 |
| | Mean value | | | | 1.275 | |

Likewise, the sample module 120 generates the mean value (1.275), and the control module 140 finds that the mean value (1.275), corresponding to the second value (9.2), does not meet the stability requirements for the beam current.

In some embodiments, the control module 140 determines a third value P (labeled in FIG. 3C) by performing a weighted interpolation in accordance with the first value B and the second value C, and adjusts the control parameter to the third value P. As a result, the tuning process of the control parameter of the system 100 is performed and converges more effectively.

Figure 3C:
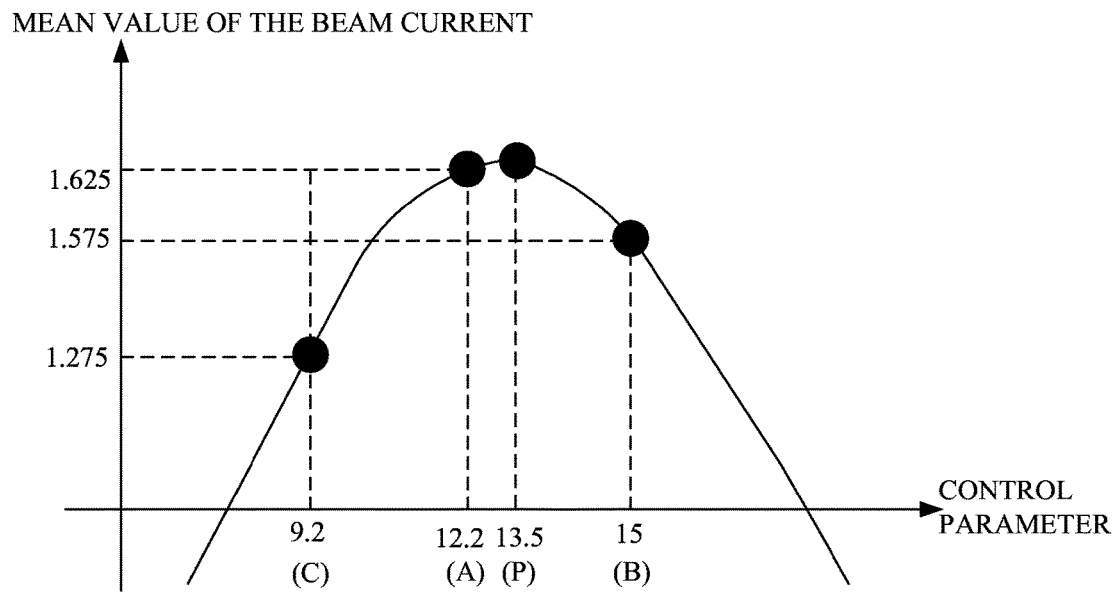
FIG. 3C is a schematic diagram illustrating operations of the system in FIG. 1, in accordance with various embodiments in Table 3.

FIG. 3C is a schematic diagram illustrating operations of the system 100 in FIG. 1, in accordance with various embodiments in Table. 3. For illustration, references are made to both of FIG. 3C and Table. 3.

For example, in this case, the control module 140 detects that the mean value (1.275), corresponding to the second value C (9.2), is less than the mean value (1.575), corresponding to the first value B (15). The control module 140 determines the third value P with concept of a quadratic function to find the maximum response of the beam current, as shown in FIG. 3C. The third value P is determined as follows:

$$D1 = 1.625 - 1.275 = 0.35$$
$$D2 = 1.575 - 1.275 = 0.3$$
$$P = [D1/(D1+D2)] \times A + [D2/(D1+D2)] \times B$$
$$= [0.35/(0.35+0.3)] \times 12.2 + [0.3/(0.35+0.3)] \times 15$$
$$= 13.488$$
$$\approx 13.5$$

The symbol A is the initial value, the symbol D1 is the difference between the summarized value, corresponding to the initial value, and the summarized value corresponding to the second value, the symbol D2 is the difference between the summarized value, corresponding to the first value, and the summarized value corresponding to the second value. As a result, the third value P is determined as 13.488. According to limit of the tuning unit (0.1), the control module 140 accordingly sets the third value P as 13.5.

Figure 3D:
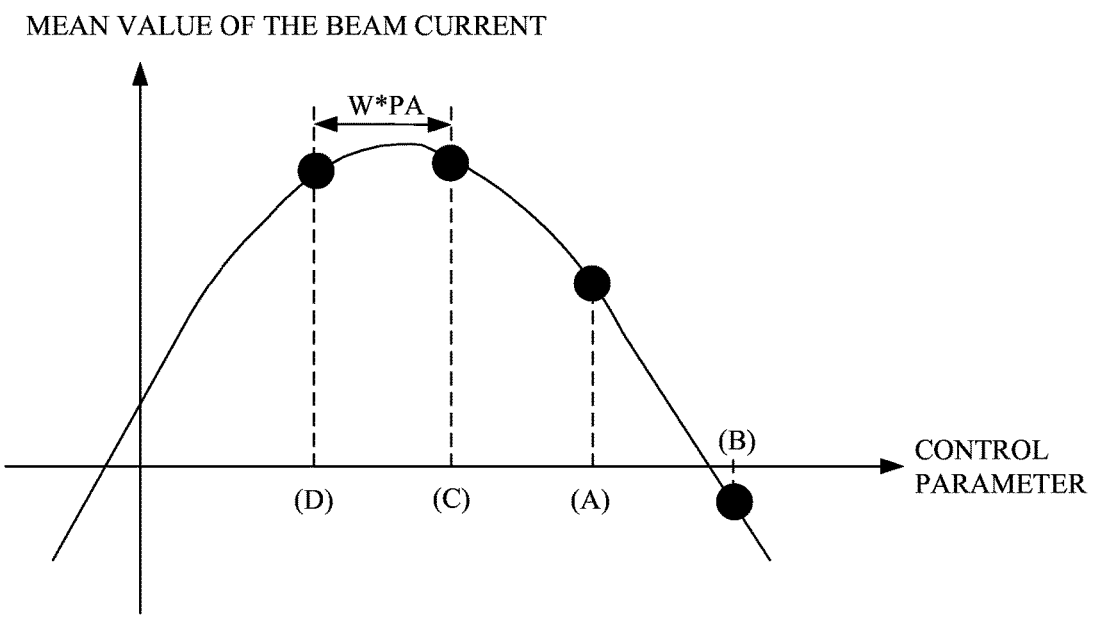
FIG. 3D is a schematic diagram illustrating operations of the system in FIG. 1, in accordance with various embodiments.

FIG. 3D is a schematic diagram illustrating operations of the system 100 in FIG. 1, in accordance with various embodiments. In some embodiments, as shown in FIG. 3D, when the summarized value C1, corresponding to the second value C, is greater than the summarized value B1, corresponding to the first value B, the control module sets the control parameter to the second value C or adjusts the control parameter to a fourth value D. The fourth value D is determined as follows:

$$D=C-w*(PA),$$

w is a weighted coefficient

After adjusting the control parameter to the fourth value D, the system 100 repeats the aforementioned tuning process to find out the maximum response. Therefore, the system 100 utilizes the aforementioned control method to tune the control parameter of the ion planter 100a as efficiently as possible.

In some embodiments, the system 100 is applied to the process data aiming for minimum response. For example, the process data aimed for minimum response include a beam angle. The sample module 120 is further configured to perform transformation for the process data before determining the summarized value. The transformation is described as follows: process data =an absolute value of |(measured value of the process data)−(target value of the process data)|. Therefore, the system 100 is able to tune the process data for either maximum response or minimum response.

In some embodiments, when failure is occurred in the hardware of the ion planter 100a, which has to be artificially corrected by a system operator, the system 100 tunes the control parameter with difficulty. In this condition, the system 100 is further configured to stop adjusting the control parameter when a predetermined requirement is reached. The predetermined requirement includes a total operation time for the tuning process or a number of times the control parameter has been tuned. When the predetermined requirement is reached, the control module 140 stops tuning and sends an alert signal to inform the system operator to correct the failure occurred in the ion implanter 100a.

In some embodiments, a method is disclosed that includes the operations below. A control parameter of an ion implanter is adjusted to a first value. Process data of the ion implanter is transformed to a summarized value, and the process data correspond to the control parameter. Tools of the ion implanter are released to perform an ion implantation in accordance with the control parameter when the summarized value meets a predetermined stability requirement.

Also disclosed is a system that includes a sample module and a control module. The sample module is configured to generate a summarized value from process data of the ion implanter, and the process data correspond to a control parameter. The control module is configured to tune a control parameter, and the control module performs an ion implantation by releasing tools of the ion implanter in accordance with the control parameter when the summarized value meets a predetermined stability requirement.

Also disclosed is a non-transitory computer readable storage medium that stores one or more programs for execution by a computer system. The one or more programs include instructions below. Sample process data of an ion implanter for a predetermined time period, and the process data correspond to a control parameter. Obtain a summarized value of the process data. Tune the control parameter when the summarized value is not within the predetermined stability range. Enable the ion implanter to perform an ion implantation in accordance with the control parameter when the summarized value meets a predetermined stability requirement.

The above illustrations include exemplary operations, but the operations are not necessarily performed in the order shown. Operations may be added, replaced, changed order, and/or eliminated as appropriate, in accordance with the spirit and scope of various embodiments of the present disclosure.

As is understood by one of ordinary skill in the art, the foregoing embodiments of the present disclosure are illustrative of the present disclosure rather than limiting of the present disclosure. It is intended to cover various modifications and similar arrangements included within the spirit and scope of the appended claims, the scope of which should be accorded with the broadest interpretation so as to encompass all such modifications and similar structures.

What is claimed is:

1. A method, comprising: performing a first calculation based on an initial value of a control parameter and a predetermined adjusted value, in order to determine a first value and assigning the first value to the control parameter of an ion implanter; transforming process data of the ion implanter to a summarized value, the process data corresponding to the control parameter that is assigned with the first value; on condition that the summarized value corresponding to the first value does not meet a predetermined stability requirement, performing a second calculation to determine a difference between the initial value and the predetermined adjusted value, in order to obtain a value different from the first value based on a result of comparing the summarized value, which corresponds to the first value, with a previous summarized value which corresponds to the control parameter that is previous to being assigned with the first value, and assigning the value different from the first value to the control parameter; and controlling tools of the ion implanter to perform an ion implantation in accordance with the control parameter on condition that the summarized value meets the predetermined stability requirement.

2. The method of claim 1, wherein performing the first calculation comprises:
determining a sum of the initial value of the control parameter and the predetermined adjusted value to obtain a first result value, wherein the first value is a smaller one of the first result value and a first threshold level.

3. The method of claim 2, wherein performing the second calculation comprises:
determining the difference between the initial value and the predetermined adjusted value to obtain a second result value on condition that the summarized value, corresponding to the first value, does not meet the predetermined stability requirement; and
adjusting the control parameter to a second value, wherein the second value is a bigger one of the second result value and a second threshold level.

4. The method of claim 3, further comprising:
determining a third value when the summarized value, corresponding to the second value, does not meet the predetermined stability requirement, and the summarized value, corresponding to the second value, is less than the summarized value, corresponding to the first value, wherein the third value is determined the following equation:

$$P=[D1/(D1+D2)]\times A+[D2/(D1+D2)]\times B,$$

wherein P is the third value, A is the initial value, B is the first value, D1 is the difference between the summarized value, corresponding to the initial value, and the summarized value, corresponding to the second value, D2 is the difference between the summarized value, corresponding to the first value, and the summarized value, corresponding to the second value.

5. The method of claim 3, further comprising:
determining a fourth value when the summarized value, corresponding to the second value, does not meet the predetermined stability requirement, and the summarized value, corresponding to the second value, is greater than the summarized value, corresponding to the first value, wherein the fourth value is determined as follows:

$$D=C-w*(PA),$$

wherein D is the fourth value, C is the second value, PA is the predetermined adjusted value, and w is a weighted coefficient.

6. The method of claim 1, wherein transforming the process data comprises:
filtering high noise data of the process data; and
characterizing the rest of the process data to the summarized value.

7. The method of claim 1, wherein the transforming the process data comprises:
removing a maximum value and a minimum value of the process data; and
averaging rest of the process data to obtain the summarized value.

8. The method of claim 1, wherein the predetermined stability requirement comprises a lower limit and an upper limit, and the summarized value meets the predetermined stability requirement in a condition that the summarized value is within a range between the lower limit and the upper limit.

9. A system comprising:
a sample module configured to generate a summarized value from process data of an ion implanter, wherein the process data correspond to a control parameter; and
a control module configured to perform a first calculation to determine a first value based on an initial value of the control parameter and a predetermined adjusted value and assign the first value to the control parameter, wherein the control module performs an ion implantation by releasing tools of the ion implanter in accordance with the control parameter on condition that the summarized value corresponding to the first value meets a predetermined stability requirement,
wherein on condition that the summarized value corresponding to the first value does not meet the predetermined stability requirement, the control module is further configured to perform a second calculation to determine a difference between the initial value and the predetermined adjusted value, in order to obtain a value different from the first value based on a result of comparing the summarized value, which corresponds to the first value, with a previous summarized value, which corresponds to the control parameter that is previous to being assigned with the first value, in order to assign the value different from the first value to the control parameter.

10. The system of claim 9, wherein the control module is configured to perform the first calculation by determining a sum of the initial value of the control parameter and the predetermined adjusted value, in order to obtain a first result value, wherein the first value is a smaller one of the first result value and a first threshold level.

11. The system of claim 10, wherein the control module is further configured to perform the second calculation by determining the difference between the initial value and the predetermined adjusted value to obtain a second result value on condition that the summarized value, corresponding to the first value, does not meet the predetermined stability requirement, and to adjust the control parameter to a second value, wherein the second value is a bigger one of the second result value and a second threshold level.

12. The system of claim 11, wherein the control module is further configured to determine a third value when the summarized value, corresponding to the second value, does not meet the predetermined stability requirement, and the summarized value, corresponding to the second value, is less than the summarized value, corresponding to the first value, wherein the third value is determined as follows:

$$P=[D1/(D1+D2)] \times A+[D2/(D1+D2)] \times B,$$

wherein P is the third value, A is the initial value, B is the first value, D1 is the difference between the summarized value, corresponding to the initial value, and the summarized value, corresponding to the second value, D2 is the difference between the summarized value, corresponding to the first value, and the summarized value corresponding to the second value.

13. The system of claim 11, wherein the control module is further configured to determine a fourth value when the summarized value, corresponding to the second value, does not meet the predetermined stability requirement, and the summarized value, corresponding to the second value, is greater than the summarized value, responding to the first value, wherein the fourth value is determined as follows:

$$D=C-w^*(PA),$$

wherein D is the fourth value, C is the second value, PA is the predetermined adjusted value, and w is a weighted coefficient.

14. The system of claim 9, wherein the sample module is configured to filter high noise data of the process data and characterize the rest of the process data to obtain the summarized value.

15. The system of claim 9, wherein the sample module is configured to remove a maximum value and a minimum value of the process data and average rest of the process data to obtain the summarized value.

16. The system of claim 9, wherein the control module is further configured to stop tuning the control parameter when a predetermined requirement is reached.

17. A non-transitory computer readable storage medium storing one or more programs, for execution by a computer system, the one or more programs comprising instructions for: sampling process data of an ion implanter for a predetermined time period, the process data corresponding to a control parameter; performing statistical analysis on the process data to obtain a summarized value of the process data; performing a first calculation to determine a first value based on an initial value of the control parameter and a predetermined adjusted value, and assigning the first value to the control parameter; on condition that the summarized value corresponding to the control parameter having the first value does not meet a predetermined stability requirement, performing a second calculation to determine a difference between the initial value and the predetermined adjusted value, in order to obtain a value different from the first value based on a result of comparing the summarized value, which corresponds to the first value, with a previous summarized value which corresponds to the control parameter that is previous to being assigned with the first value, and assigning the value different from the first value to the control parameter; and controlling the ion implanter to perform an ion implantation in accordance with the control parameter on condition that the summarized value meets the predetermined stability requirement.

18. The non-transitory computer readable storage medium of claim 17, wherein performing the first calculation comprises:
   determining a sum of the initial value of the control parameter and the predetermined adjusted value to obtain a first result value; and
   adjusting the control parameter to the first value, wherein the first value is a smaller one of the first result value and a first threshold level.

19. The non-transitory computer readable storage medium of claim 18, wherein performing the second calculation comprises:
   determining the difference between the initial value and the predetermined adjusted value to obtain a second result value on condition that the summarized value, corresponding to the first value, does not meet the predetermined stability requirement; and
   adjusting the control parameter to a second value, wherein the second value is a bigger one of the second result value and a second threshold level.

20. The non-transitory computer readable storage medium of claim 19, wherein the instructions are further configured for:
   adjusting the control parameter to a third value on condition that the summarized value, corresponding to the second value, does not meet the predetermined stability requirement, wherein third value is determined with the first value, the second value and at least one weighted coefficient.

* * * * *